US008875066B2

(12) United States Patent
Fan et al.

(10) Patent No.: US 8,875,066 B2
(45) Date of Patent: Oct. 28, 2014

(54) PERFORMING IMAGE CALCULATION BASED ON SPATIAL COHERENCE

(71) Applicant: Synopsys, Inc., Mountain View, CA (US)

(72) Inventors: Yongfa Fan, Sunnyvale, CA (US); Thomas Schmoeller, Hoehenkirchen (DE)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/832,134

(22) Filed: Mar. 15, 2013

(65) Prior Publication Data

US 2014/0282298 A1 Sep. 18, 2014

(51) Int. Cl.
*G06F 17/50* (2006.01)

(52) U.S. Cl.
CPC .................................. *G06F 17/5081* (2013.01)
USPC .................... 716/53; 716/51; 716/54; 716/55

(58) Field of Classification Search
USPC ................................................ 716/51, 53–55
See application file for complete search history.

(56) References Cited

U.S. PATENT DOCUMENTS

| | | | | | |
|---|---|---|---|---|---|
| 5,644,390 | A | * | 7/1997 | Yasuzato | ........................ 356/121 |
| 6,072,631 | A | * | 6/2000 | Guenther et al. | ............. 359/569 |
| 6,127,071 | A | * | 10/2000 | Lu | ..................................... 430/5 |
| 7,010,776 | B2 | * | 3/2006 | Gallatin et al. | ................. 716/53 |
| 8,004,656 | B2 | * | 8/2011 | Fiolka et al. | ..................... 355/67 |
| 8,059,262 | B2 | * | 11/2011 | Yamazoe | ......................... 355/77 |
| 8,136,054 | B2 | * | 3/2012 | Chen et al. | ....................... 716/50 |
| RE44,042 | E | | 3/2013 | Yun et al. | |
| 8,405,059 | B2 | | 3/2013 | Heintzmann et al. | |
| 8,411,253 | B2 | * | 4/2013 | Sekine et al. | .................... 355/77 |
| 8,427,654 | B2 | | 4/2013 | Horn et al. | |
| 8,427,725 | B2 | | 4/2013 | Futterer et al. | |
| 8,427,731 | B2 | | 4/2013 | Laino et al. | |
| 8,432,553 | B2 | | 4/2013 | Waller et al. | |
| 8,433,199 | B2 | | 4/2013 | Fleischer et al. | |
| 8,527,253 | B2 | * | 9/2013 | Zhang et al. | ..................... 703/13 |
| 2005/0015233 | A1 | * | 1/2005 | Gordon | ........................... 703/13 |
| 2007/0081137 | A1 | * | 4/2007 | Lin | ................................. 355/55 |
| 2007/0253637 | A1 | * | 11/2007 | Adam | ........................... 382/274 |
| 2009/0231562 | A1 | * | 9/2009 | Yoshii et al. | .................... 355/53 |
| 2010/0053580 | A1 | * | 3/2010 | Sekine et al. | ................... 355/53 |
| 2012/0258407 | A1 | * | 10/2012 | Sirat | .............................. 430/322 |
| 2013/0088723 | A1 | | 4/2013 | Feldkhun | |
| 2013/0128232 | A1 | | 5/2013 | Laino et al. | |

OTHER PUBLICATIONS

"Comparison of three TCC calculation algorithms for partially coherent imaging simulation," by Wu et al., Sixth International Symposium on Precision Engineering Measurements and Instrumentation, edited by Jiubin Tan, Xianfang Wen, Proc. of SPIE vol. 7544, 2010.

(Continued)

*Primary Examiner* — Naum B Levin
(74) *Attorney, Agent, or Firm* — Adams Intellex, PLC

(57) ABSTRACT

Computer-implemented techniques for pixel source optics calculations using spatial coherence are disclosed. Pixelated sources are used for source-mask co-optimization to enhance semiconductor lithography. Calculation of a partially coherent imaging system is used for optical-lithography simulation. The spatial coherence property of neighboring source points is used to reduce imaging calculation complexity. Two or more neighboring points are treated as one pseudo-spatially coherent area element.

33 Claims, 7 Drawing Sheets

(56) References Cited

OTHER PUBLICATIONS

"Fast and accurate computation of partially coherent imaging by stacked pupil shift operator," by Lian, Yaogang, and Xin Zhou, Proc. SPIE. vol. 7488. 2009.

"Hybrid Hopkins-Abbe Method for Modeling Oblique Angle Mask Effects in OPC," by Adam & Lam, Proc. of SPIE vol. 6924, 2008.

"Sum of coherent systems decomposition by SVD," by Cobb, Nick, University of California at Berkeley, Tech. Report, 1995.

"Computation theory of partially coherent imaging by stacked pupil shift matrix," by Yamazoe, Kenji, JOSA A 25.12, 2008, p. 3111-3119.

\* cited by examiner

FIG. 4C

PERFORMING IMAGE CALCULATION BASED ON SPATIAL COHERENCE

FIELD OF ART

This application relates generally to image modeling and more particularly to pixel source optics calculations.

BACKGROUND

Market demands continue to force improvements in the capabilities and features of modern, state-of-the-art semiconductor circuits and systems. These improvements drive a race towards ever-decreasing feature sizes, the minimum dimensions of the components which make up circuits, rendering the components increasingly difficult to construct. Modern integrated circuits, commonly called chips, are widely used in a great variety of devices and systems, thus construction of the chips must be both efficient and cost effective. Chips are typically manufactured using highly complex techniques based on elaborate, multi-step processes including lithographic (printing) processing steps and chemical (developing) processing steps. The processing is performed on a semiconductor substrate such as silicon, although other materials, including compound semiconductors formed from materials such as gallium and arsenic are also used. Modern fabrication processes may consist of hundreds of manufacturing and handling steps. In order for a given electronic device or system to function as designed, each and every step in the fabrication process is required and must be completed successfully. Each lithographic, processing, and handling step has a critical and unique purpose. For example, the lithographic process steps are used to expose, or "print," desired patterns and features onto a semiconductor substrate. The process of printing a semiconductor substrate is reminiscent of photographic processes involving shining light through a negative to expose light sensitive paper. In the case of semiconductor printing, specific wavelengths of light are shone through masks to print extremely fine structures onto a substrate. Following a printing step, the physical structures are revealed by chemically processing the printed substrates. Returning to the photography analogy, the chemical processing "develops" the fine structures and patterns on the substrates much as certain chemicals develop images on light-exposed photographic paper. At a specific level on the substrate, the chemical processing removes unwanted, superfluous material while leaving intact the desired structures and patterns printed during the lithographic step. The lithographic and chemical processing steps are repeated as many times as required to produce the desired configuration on the substrate.

While other lithography techniques exist, photolithography remains the predominant technology used today for the printing of minimum-sized features and structures onto a semiconductor substrate. In these light-based approaches, light shines through a mask to transfer the mask pattern onto the substrate. The printing may be positive (direct transfer) or negative (reversed transfer). Since the minimum feature sizes of patterns and structures on the chips are now comparable to, smaller, or even much smaller than the wavelength of visible light, lithographic techniques must constantly evolve to keep pace. Improved mask techniques have been developed, as have light sources with shorter wavelengths to support printing of ever-smaller features and structures. The combination of improved masks and decreased light wavelengths has significantly improved the resolution of fine feature and structure sizes on a chip. After the features and structures have been printed, advanced chemical processing must resolve the small design details in such a way that all of the resulting features and structures operate correctly and as designed. In order to produce a working chip, the many lithographic and chemical processing steps must all function properly to accurately produce the desired patterns and structures which make up the chip.

SUMMARY

Techniques implemented to improve calculation of partially coherent imaging are used in optical lithography simulation for fabrication of integrated circuits. Optical lithography simulation is applied to optical proximity correction (OPC) and rigorous modeling. Pixelated light sources for source-mask co-optimization enhance optical resolution for current and emerging technology nodes. The spatial coherence property of neighboring source points is used to speed partially coherent imaging calculations. A quantity of neighboring source points is treated as one pseudo spatially coherent area element. The result is to reduce the number of incoherent source points which thereby reduces computation requirements while still maintaining high resolutions on source and pupil. Given two or more points which are sufficiently close together, those points are essentially spatially coherent. Thus, the resulting image from the two or more points is treated as coherent summation instead of incoherent summation. Coherent summation reduces the number of coherent systems for sum of coherent systems (SOCS) calculations. The result is faster Eigen value decomposition for kernel truncation. A computer-implemented method for image analysis is disclosed comprising obtaining a set of source points for an image; determining that two or more points from the set of source points are neighboring source points; evaluating spatial coherence between the neighboring source points; and performing image calculation based on the spatial coherence.

The method may further comprise performing optical proximity correction based on the image calculation. The image calculation may include Eigen value decomposition. The Eigen value decomposition may be part of kernel truncation. The two or more points may have spatial coherence. The method may further comprise reducing a number of points for calculation based on the spatial coherence. The reducing may be based on an elimination of an assumption of incoherency. The method may further comprise reducing calculation complexity based on the reducing of the number of points for calculation due to a reduced number of incoherent points. The set of source points may comprise a source map. The method may further comprise dividing the source map into pseudo-coherent cells. The dividing may be accomplished using a course grid. The method may further comprise using one cell from the course grid to form a new pseudo coherent system. The new pseudo coherent system may be formed by convolving the one cell with a lens pupil function. The course grid may comprise pseudo spatially coherent cells. The set of source points may comprise pixelated sources. The neighboring source points may be determined based on dividing a source map into pseudo coherent cells. The dividing may be based on a course grid. The method may further comprise convolving one of the pseudo coherent cells with a pupil to form a pseudo coherent system. The image calculation may be fast image calculation. The set of source points may comprise a source map and wherein the method further comprises dividing the source map into pseudo-coherent cells using a course grid; using at least one cell from the course grid to form a new pseudo coherent system wherein the new pseudo coherent system is formed by convolving the at least one cell with a lens pupil function; and performing optical proximity correction based on the image calculation.

In embodiments, a computer-implemented method for image analysis may comprise: obtaining a set of source points for an image; determining that two or more points from the set of source points are neighboring source points; for the neighboring source points, evaluating a correlation for light waves so that the neighboring source points can be treated as one point from an image calculation perspective; and performing image calculation, for semiconductor lithography, based on the neighboring source points being treated as one point. In some embodiments, a computer system for image analysis may comprise: a memory which stores instructions; one or more processors coupled to the memory wherein the one or more processors are configured to: obtain a set of source points for an image; determine that two or more points from the set of source points are neighboring source points; evaluate spatial coherence between the neighboring source points; and perform image calculation based on the spatial coherence. In embodiments, a computer program product embodied in a non-transitory computer readable medium for image analysis may comprise: code for obtaining a set of source points for an image; code for determining that two or more points from the set of source points are neighboring source points; code for evaluating spatial coherence between the neighboring source points; and code for performing image calculation based on the spatial coherence.

Various features, aspects, and advantages of various embodiments will become more apparent from the following further description.

BRIEF DESCRIPTION OF THE DRAWINGS

The following detailed description of certain embodiments may be understood by reference to the following figures wherein:

FIG. 4C is an example matrix representation for an imaging system for pixel coherency.

DETAILED DESCRIPTION

State-of-the-art electronic devices and systems are based on very large numbers of semiconductor devices. As device counts increase to the tens or even hundreds of millions of active devices, the physical dimensions, or "feature sizes," of individual devices decrease. The minimum feature sizes of stable or mature fabrication processes are routinely comparable to the wavelength of visible light, while advanced technology nodes include feature sizes which are smaller—even significantly smaller—than the wavelength of visible light. Many of these advanced technologies are fabricated using processes based on lithographic and chemical processing. However, successful optical lithography is becoming increasingly difficult to attain. The challenges encountered by attempts to simulate optical-lithography systems for optical proximity corrections (OPC) with the needed rigorous modeling have become exceedingly complex. In addition, pixelated sources are required for source-mask co-optimization at state-of-the-art technology nodes. The pixelated source may include a very large number of source points. As a result, the application of pixelated sources significantly slows the calculation of partially coherent imaging for lithography simulation because of increased computational requirements.

Calculation using pixelated sources has significantly slowed lithography simulation. The increased numbers of computations required become a bottleneck to constructing optical proximity correction (OPC) models. To bypass this bottleneck, the property of spatial coherence of neighboring source points is used, reducing computational complexity. That is, neighboring source points are grouped together and treated as one pseudo-spatially coherent area element, provided the neighboring points are shown to be spatially coherent. The result is fewer elements that must be evaluated as part of a lithography simulation.

In the disclosed concept, the property of spatial coherence for neighboring source points is used to perform efficient computation of partially coherent imaging calculations. Neighboring source points are treated as one pseudo-spatially coherent area element of the source image. The spatially coherent area element includes two or more source points. If the points are sufficiently close together, they may be considered spatially coherent. The resulting image from the two or more spatially coherent points can be treated as coherent summation rather than incoherent summation. Coherent summation reduces the number of coherent systems for sum of coherent systems (SOCS) evaluations. The simplification can significantly speed up the Eigen-value decomposition process for kernel truncation, resulting in a reduced number of incoherent points that must be evaluated and maintaining high resolution sources and pupils.

Figure 1:
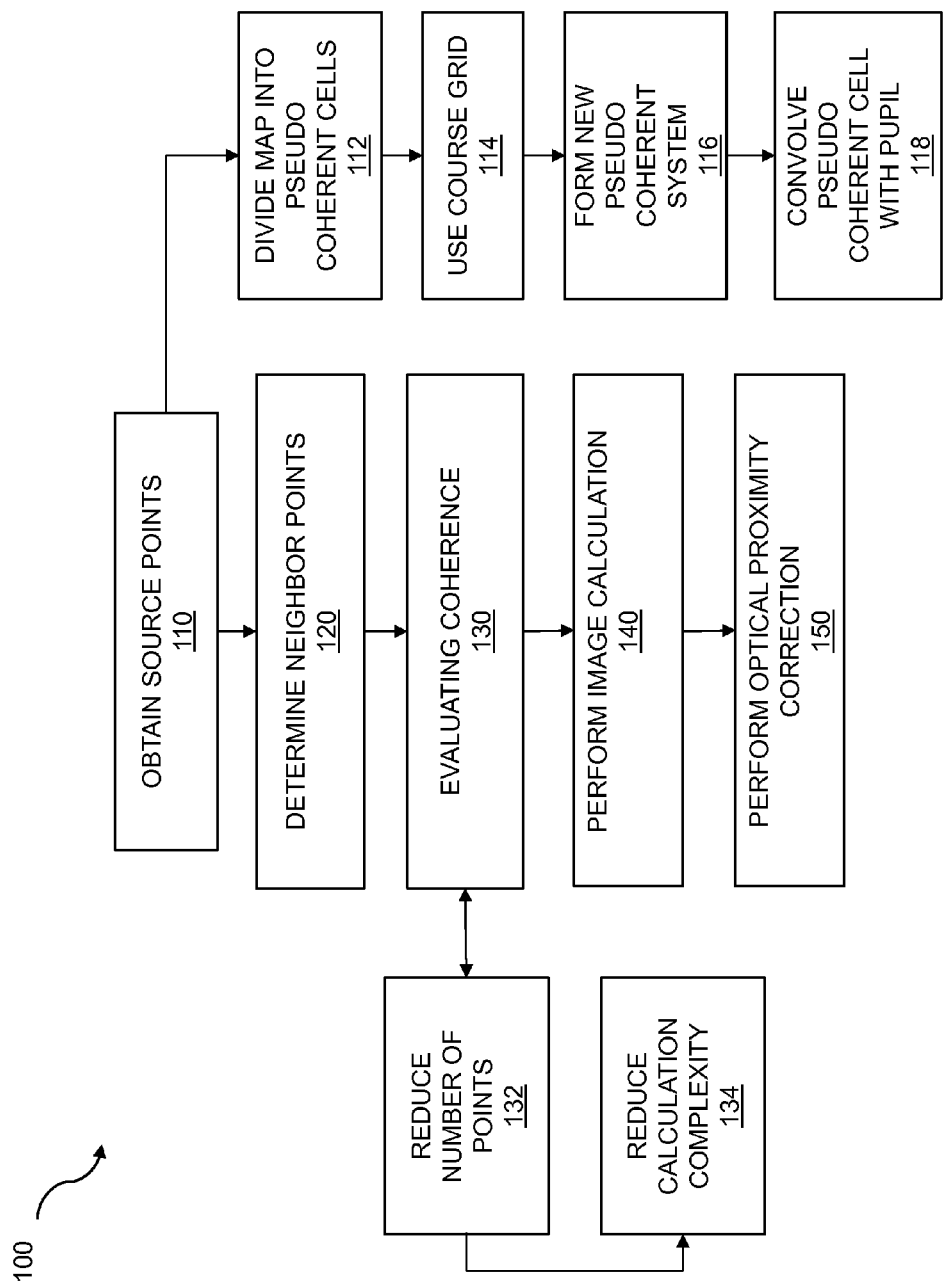
FIG. 1 is a flow diagram for pixel-source optics calculation.

FIG. 1 is a flow diagram for pixel-source optics calculation. The flow 100 describes a computer-implemented method for image analysis. In embodiments, the image is part of a partially coherent imaging system to be simulated. The simulation may be part of optical proximity correction and may require rigorous modeling. The image may include pixelated sources which are required for source-mask co-optimization to enhance optical resolution. The flow 100 includes obtaining a set of source points 110 for an image, including a representation of a source and a pupil. The obtaining may be accomplished by analyzing source information already in an electronic design automation (EDA) tool, by importing source points from storage, by evaluating possible sources, or by other techniques. The source and the pupil may represent parts of a lithography system. The representations may be in the forms of matrices. The set of source points may comprise a source map, where points on the source map may be represented by real or imaginary values. The source map may be used for lithography simulation where the simulation may include OPC and rigorous modeling.

The flow 100 may further comprise dividing the source map into pseudo-coherent cells 112. Neighboring points in a source map may be deemed spatially coherent based on a spatial coherence property. The pseudo-spatially coherent points may be fewer in number than the number of points in the source map. The dividing of the source map into pseudo-coherent cells may be based on a course grid 114. In embodiments, other grids, including a fine grid or a medium grid, may be used. The flow 100 may further comprise using one cell from the course grid to form a new pseudo-coherent system 116. The number of cells in the new pseudo-coherent system may be fewer than the number found in the original system. A new pseudo-coherent system may reduce the computational complexity of OPC and rigorous modeling. The flow 100 may include convolving one of the pseudo-coherent cells with a pupil 118 to form a pseudo-coherent system. The convolution may be part of optical lithography simulation. Convolving a pseudo cell with a lens-pupil function may form the new pseudo-coherent system. A range of appropriate point values may represent the pupil. For example, values representing an area outside a pupil may be represented by a value such as zero, while values representing the pupil may be represented by a value such as one. The convolution may be performed on a square matrix, a rectangular matrix, a so-called "fat" matrix, and so on. The number of computations required to perform the convolution may be dependent on the square of one of matrix dimension multiplied by the other dimension.

The flow 100 includes determining that two or more points from the set of source points are neighboring source points 120. Neighboring points may be points which are adjacent points in a source image. Neighboring points may be to the east or west or to the north or south of a given point. Any number of points may be considered neighboring points, as long as, for example, the number of points comprises at least two points (the original point plus a neighbor point). Other numbers of neighboring points may be considered. For example, clusters of neighboring points consisting of 4, 9, 16, or another number of points may be considered neighboring points.

The flow 100 includes evaluating spatial coherence 130 between the neighboring source points. Evaluating spatial coherence may be part of rigorous modeling on optical lithography simulation for OPC. A set of source points may include neighboring points which are spatially coherent and neighboring points which are spatially incoherent. A priori knowledge of which neighboring points are spatially coherent and which points are spatially incoherent may not be available. A pixelated source may be used for source-mask co-optimization to enhance optical resolution. Evaluating spatial coherence may be performed to determine whether source points may be considered spatially coherent and thus may be consolidated into larger pseudo-coherent cells. The flow 100 may further comprise reducing a number of points 132 for calculation based on the spatial coherence. Two or more neighboring points may be spatially coherent based on a spatial coherence property. A set of neighboring source points may be treated as a pseudo-spatially coherent area element. Multiple sets of neighboring source points may be treated as multiple pseudo-spatially coherent area elements. Two or more source points may be treated as a pseudo-spatially coherent area. By combining spatially coherent source points into one or more pseudo spatially coherent areas, the number of points included in a simulation may be reduced. The reducing may be based on an elimination of an assumption of incoherency. The flow 100 may further comprise reducing calculation complexity 134 based on the reducing of the number of points for calculation due to a reduced number of incoherent points. As stated above, two or more neighboring points may be considered spatially coherent and may be combined into a pseudo-spatially coherent imaging area. The resulting image from the two or more combined points may be treated as a coherent summation instead of an incoherent summation. Such coherent summations may reduce the number of coherent systems for sum of coherent systems (SOCS) computations.

The flow 100 includes performing image calculation 140 based on the spatial coherence. As stated above, calculation of partially coherent imaging may be part of rigorous modeling for optical lithography simulation on OPC. Further, the calculating may be part of source-mask co-optimization used in resolution enhancement based on the shrinking feature sizes found in smaller technology nodes. The efficiency of image calculations may be enhanced by the use of the pseudo-spatially coherent area elements determined above. The image calculation may include Eigen-value decomposition or other computations. The Eigen-value decomposition may be part of kernel truncation or another technique.

The flow 100 may further comprise performing optical proximity correction 150 based on the image calculation. Optical proximity correction (OPC) may be included in the processing of semiconductor wafers in order to correct or compensate for fabrication deficiencies resulting from the limitations of optical systems or from processing defects. The image calculation may determine areas of an image which may be improved as a result of OPC. OPC may result in pattern changes on one or more masks. The mask changes may include adding material to a pattern or removing material from a pattern. The result of OPC may be improved image integrity resulting in improved lithography and processing of semiconductor wafers. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
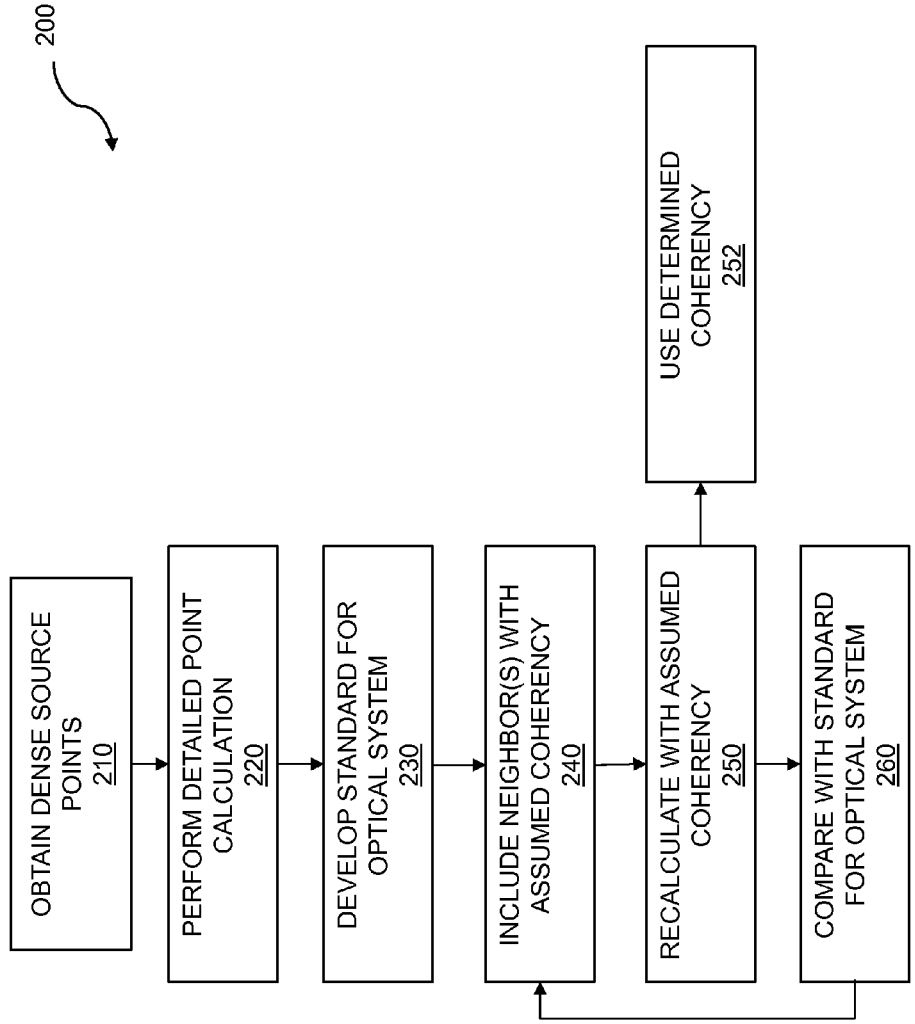
FIG. 2 is a flow diagram showing the forming of a pseudo-coherent system.

FIG. 2 is a flow diagram showing the forming of a pseudo-coherent system. A flow 200 may continue from or be part of a previous flow 100. In some embodiments, the flow 200 may stand on its own and may work from a pre-existing semiconductor chip design including partially coherent imaging. The pseudo-coherent system may be formed to describe an optical-lithography system. The flow 200 includes obtaining dense source points 210. The source points may describe an optical lithography system. The number of source points may be large. The source points may be used for lithography simulation for OPC and for rigorous modeling. The computational complexity of the simulation problem may be large.

The flow 200 includes performing detailed point calculations on source points 220. The calculations may include convolution, where a set of source points may be convolved with a function. A function may be a pupil function. The number of points in the source may be large, resulting in large numbers of calculations being required by the convolution. The numbers describing the source may be real or may be complex. The magnitude of the coefficients of the real or imaginary numbers may be between zero and one. The image calculation may be fast image calculation.

The flow 200 includes developing a standard for an optical system 230. The standard for the optical system may be used for simulation purposes. The standard may be used as a benchmark against which to compare simulation results generated by other means. Other simulations may be based on using pseudo-spatially coherent area elements, for example. As mentioned above, the standard may be used for simulation of OPC and rigorous modeling. The standard may be used to validate pseudo spatially coherent assumptions.

The flow 200 further comprises including neighbors with assumed coherency 240. Neighboring points may be treated as pseudo-spatially coherent based on a spatial coherence property. Two or more neighboring points may be considered for spatial coherency. Neighboring source points may be treated as one pseudo-spatially coherent area element. Since the number of neighboring source points must be two or more, the number of pseudo spatially coherent area elements may be fewer than the number of source points.

The flow 200 includes recalculating point calculations with assumed coherency 250. Recall that the points may be considered spatially coherent if they are neighbors. The recalculating may be performed in less time than the detailed-point calculation since the number of pseudo-spatially coherent area elements may be less than the number of source points. The image calculation may be fast image calculation. The flow 200 includes using a determined coherency 252. A determined coherency may be used to identify how many neighboring cells may be included in a pseudo spatially coherent area element. A determination of neighboring cells may be made based on a crosshatch pattern. Since a pseudo-spatially coherent area element includes two or more neighboring source points, there may be fewer elements required for point calculations.

The flow 200 includes comparing the recalculation results of 250 against a standard for an optical system 260. The standard for an optical system may be developed for an optical system from detailed point calculations (e.g. 220 above). The results of a comparison may be fed back into the determining and inclusion of neighbors with assumed coherency. Steps 240, 250, and 260 may be performed one or more times in order to best choose the neighbors to include in an assumed coherency. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Figure 3:
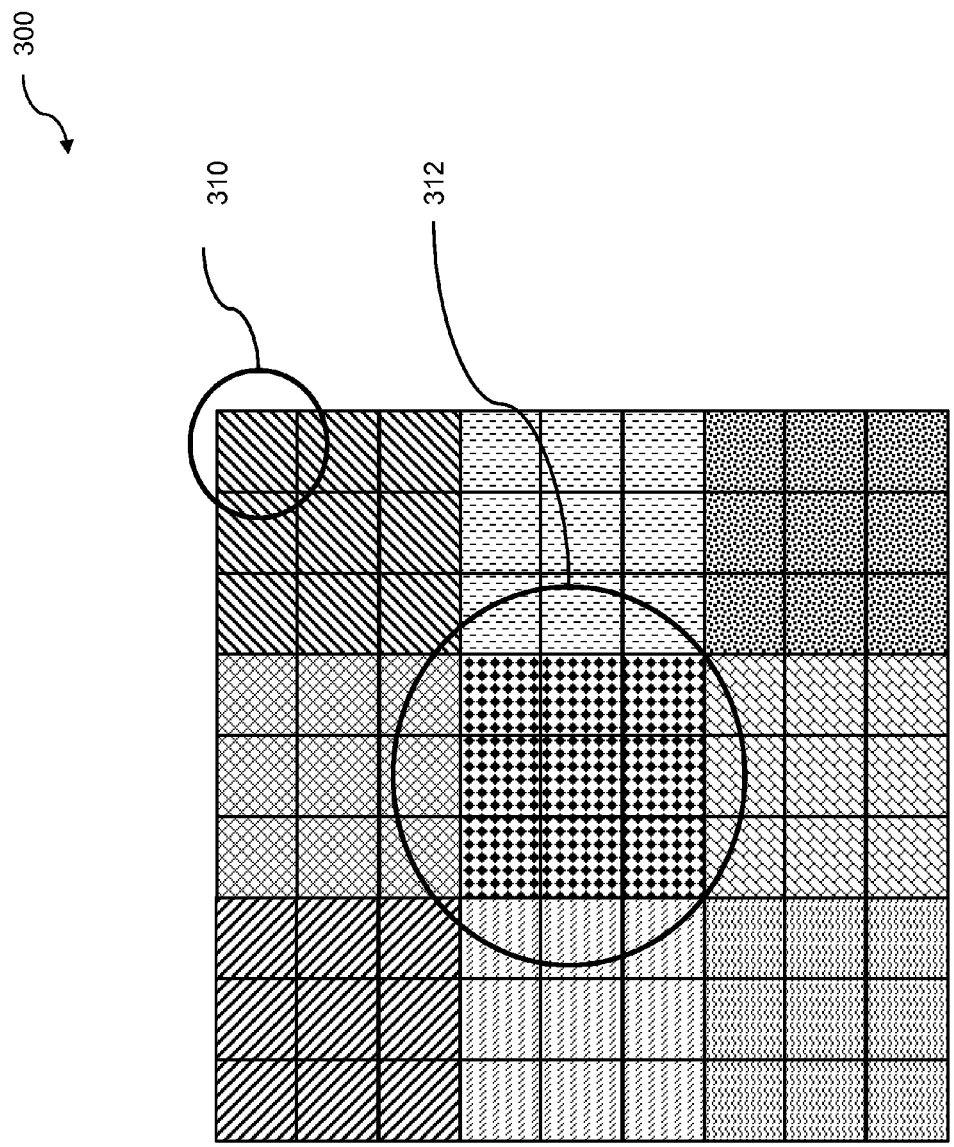
FIG. 3 is an example set of points showing a pseudo-coherent element.

FIG. 3 is an example set of points showing a pseudo-coherent element. A group of points or pixels 300 is shown to illustrate a source. The source may be included in an optical lithography simulation. The set of source points may comprise pixelated sources. The simulation may be undertaken for optical proximity correction (OPC) or for rigorous modeling. The group of points 300 may represent a matrix, a grid, a map, and the like. An individual point or cell is shown 310. An individual point 310 may be one of a group of points or cells. While a group including a nine-by-nine array of points is shown, any number of points appropriate to the simulation may be included. Neighboring points may be spatially coherent or spatially incoherent. Spatially coherent points or pixels may be combined into a pseudo-spatially coherent area element 312. While 312 shows one example pseudo-spatially coherent area element, any number of elements may be present. The elements may represent different crosshatch patterns, for example. In group 300, any of the nine-element regions may be pseudo-spatially coherent area elements. The neighboring source points may be determined based on dividing a source map into pseudo-coherent cells. The combining of points may be based on a spatial coherence property. A spatial coherence property may be used to speed up optical lithography simulation. The combining of points may be based on results of rigorous modeling. The area element may include two or more points from the source. The two or more points may have spatial coherence. A course grid may be used to determine points for spatial coherence. The course grid may comprise pseudo-spatially coherent cells. While a course grid is shown, other appropriate grids may be used, including fine grids, medium grids, and so on. Imaging calculations may include partially coherent imaging calculations. Spatially coherent points may be considered as one pseudo-spatially coherent area element. Each area may be considered as one pseudo-coherent system. Since two or more points may be included into one or more pseudo spatially coherent area elements, the number of areas to be simulated may be reduced. The number of incoherent points may be reduced while the high resolution of a source and a pupil may be maintained. The image resulting from combining two or more source points may be treated as a coherent summation rather than an incoherent summation. Coherent summations may reduce the number of coherent systems for sum of coherent systems (SOCS) computations. A reduction in SOCS computations may result in improved Eigen-value decomposition processes for kernel truncation, for example.

Simulation of an optical lithography system may be quite complex and computationally intensive. The calculations depend on the configuration of the system being simulated, simplifying assumptions which may be made about the system, and so on. For example, one may assume a simplified optical system consists of various components including a light source, one or more lenses, an object, and an image. The simulation of the optical system may be based on partially coherent imaging as formulated by Hopkins. Hopkins' formulation includes a four-dimensional transmission factor or transmission cross coefficient (TCC). Solving Hopkins' equation includes quadruple integrals over a pupil plane. Numerical calculation algorithms, including Kintner's algorithm, require large computational capabilities, including large amounts of storage space, because of the four-dimensional TCC. To speed the calculation of partially coherent imaging systems, derivative algorithms have been proposed, including an algorithm based on a physical interpretation of Hopkins' equation, and another algorithm based on a matrix treatment of partially coherent imaging. Other algorithms exist as well.

One physical interpretation of Hopkins' formulation is called Abbe's method, which is based on point source decomposition. Partially coherent illumination (e.g. a light source) may be regarded as a set of mutually incoherent point sources, where each point source may form a light-intensity distribution on a plane such as an image plane. An incoherent summation of all of the light intensities emitted by the point sources may create an image. Abbe's method does not use the TCC but instead relies upon fast Fourier transforms (FFT), which are computationally more efficient than other methods. The number of calls to FFT routines may limit the speed of Abbe's method, however. For example, for N instances of mutually incoherent point sources, N calls to FFT routines are required.

Matrix-based treatments of Hopkins' method have been proposed for solving coherent imaging problems. A matrix treatment may be computationally intensive and, as a result, time consuming, depending on the problem to be solved. That is, the sum of coherent system (SOCS) computations may require larger computational resources including computation time and storage than the physical interpretation-based methods, even with reduced calls to FFT routines. One approach that reduces computational requirements avoids use of the TCC by reducing instances of calls to FFTs. The approach changes the analytical representation of Abbe's method to a matrix representation. A singular matrix P is derived from an effective light source and from a pupil function. A matrix P may be obtained by a discrete pupil function. Shifting a pupil function and stacking two-dimensional pupil functions into one dimension may obtain each row of a matrix P. Singular value decomposition (SVD) is applied to a singular matrix P to obtain Eigen values and Eigen functions. An image may be computed from Eigen values and Eigen functions without the use of a TCC and with fewer calls to FFT routines.

A simplified example optical system may be based on a light source, a condenser lens, an object, one or more lenses for projection optics, an image, and so on. A coordinate system may be selected for convenience. For example, a coordinate system on an image plane may include (x, y), and the coordinate system on a light source and a pupil plane may include (f, g). A detailed computation of the image system may include a number of sampling grids of a pupil, where that number may be equal to that of an effective light source.

An example equation describing an analytical representation of Abbe's method of coherent source point calculation may be written as:

$$I_{ps}(x,y) = \iint S_{ps}(f',g') |FT[â(f-f', g-g')P(f,g)]|^2 df'dg' = \iint \sqrt{S_{ps}(f',g')} FT[â(f-f', g-g')P(f,g)]|^2 df'dg'$$

For this equation, I is the image description, â is an object spectrum or diffracted light amplitude, P is a pupil function, S is an effective light source, and FT represents the two-dimensional Fourier transform operation. If convenient, the equation may be rewritten in discrete form since the computation may involve a discrete image calculation. A discrete form of the equation thus replaces the integrals with summations. In addition, the equation may be represented in matrix form. The meaning of the equation and its terms are based on a plane wave which may be emitted from a point source ($f_i'$, $g_j'$) and which may illuminate an object. Light diffracted by an object may be shifted depending on an incidence angle of a given plane wave. A pupil filters diffracted light from an object to a light-intensity distribution on an image plane. The light intensity emitted by each point source may be added together to form a sum which creates an image.

Figure 4A:
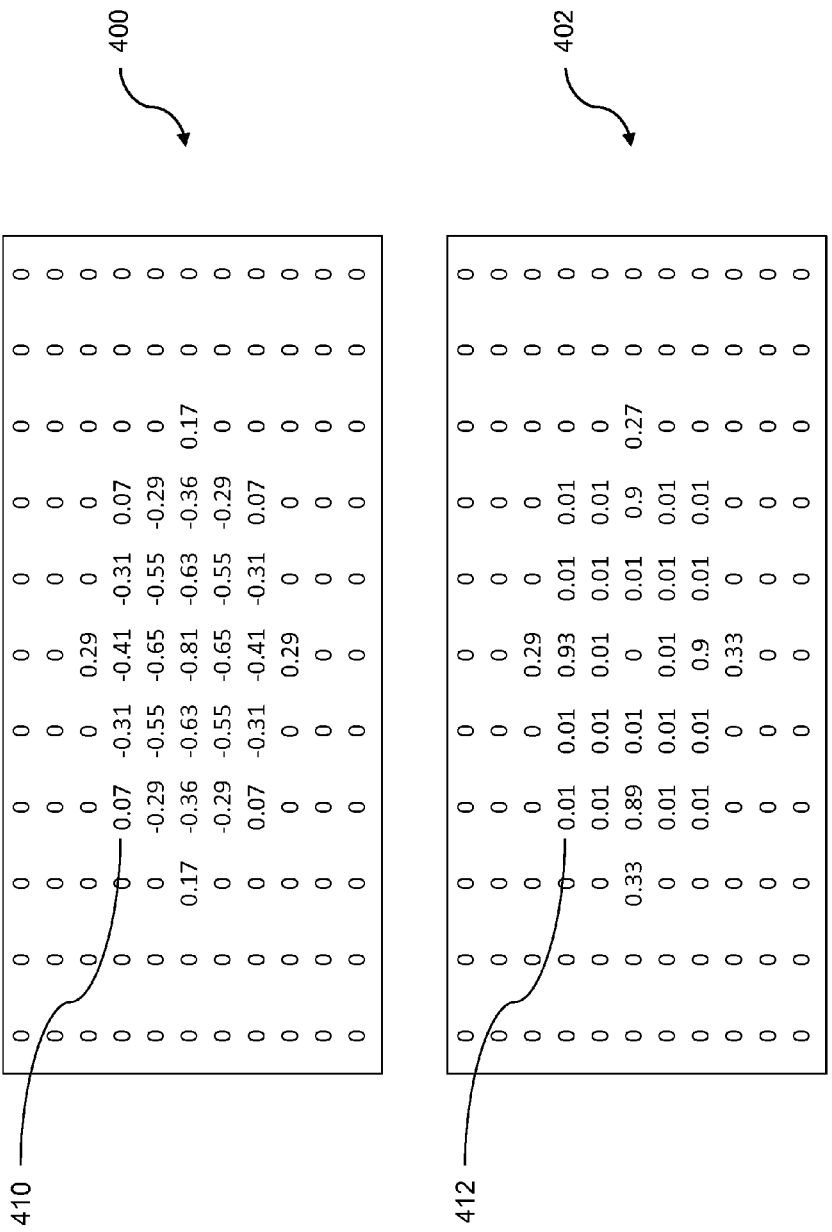
FIG. 4A is an example matrix representation of a pupil and source.

FIG. 4A is an example matrix representation of a pupil and source. A matrix of numbers 400 is shown to illustrate an example pupil. The matrix may be part of a representation of an optical system. A computer-aided design tool may generate such a matrix. The matrix may be used for solving an optical system, including optical systems for lithography of semiconductor circuits and systems. Solving the optical system may include pseudo spatially coherent optics systems. While an eleven-by-eleven matrix is shown, a matrix with any dimensions appropriate to representing a pupil may be present. The matrix 400 may represent a pupil for an optics system. The pupil may have a polarization state including one or more polarization states. The pupil may be represented by nonzero values 410, while an area outside a pupil may be represented by values equal to zero or some other appropriate number. The matrix values may be real or imaginary values.

A matrix of numbers 402 is shown to illustrate an example source. The source may be an illumination source. As before, a matrix may be part of an optical system and may be used for solving an optical system. A computer-aided design tool may generate the matrix. The matrix may be used for solving an optical system, including optical systems for lithography of semiconductor circuits and systems. Solving the optical system may include pseudo-spatially coherent optics systems. While an eleven-by-eleven matrix is shown, a matrix with any dimensions appropriate to representing a source may be present. The matrix 402 may represent a source—for example, an illumination source—for an optics system. The source may be represented by nonzero values 412, while an area outside a source may be represented by values equal to zero or some other appropriate number. The matrix values are non-negative real values.

Figure 4B:
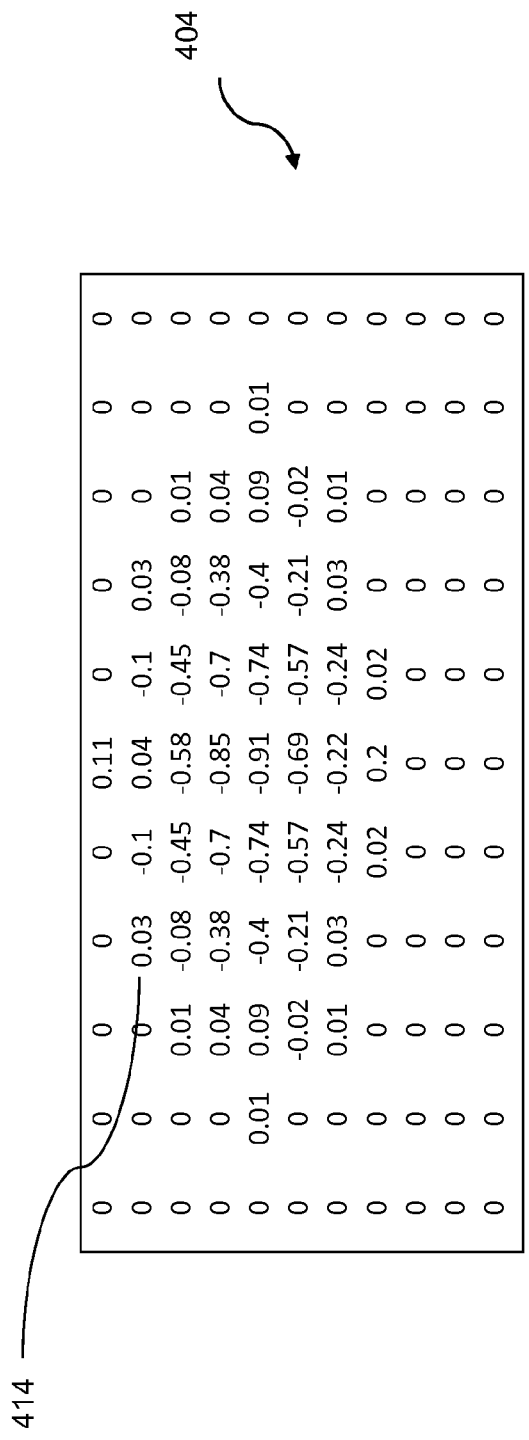
FIG. 4B is an example matrix representation for convolution of a pupil and a source.

FIG. 4B is an example matrix representation for convolution of a pupil and a source. A matrix of numbers 404 is shown to illustrate an example convolution of a pupil and source. The source may be an illumination source. The matrix, including a convolution of pupil and source, may be calculated by a computer-aided design tool, by a convolution method, by fast Fourier transforms (FFTs), and so on. A convolution may result from a pseudo coherent element of convenient size. A pseudo coherent element size may be two by one, three by three, and so on. As before, a pupil and source may be parts of an optical system, including optical systems for lithography of semiconductor circuits and systems. Similarly, the matrix may be used for solving an optical system, including optical systems for lithography of semiconductor circuits and systems. Solving the optical system may include pseudo-spatially coherent optics systems. While an eleven-by-eleven matrix is shown, a matrix with any dimensions appropriate to representing a convolved pupil and source may be used. Convolutions results may be represented by nonzero values 414, while an area outside a convolved pupil and source may be represented by values equal to zero or some other appropriate number. The matrix values may be real or imaginary values.

Figure 4C:
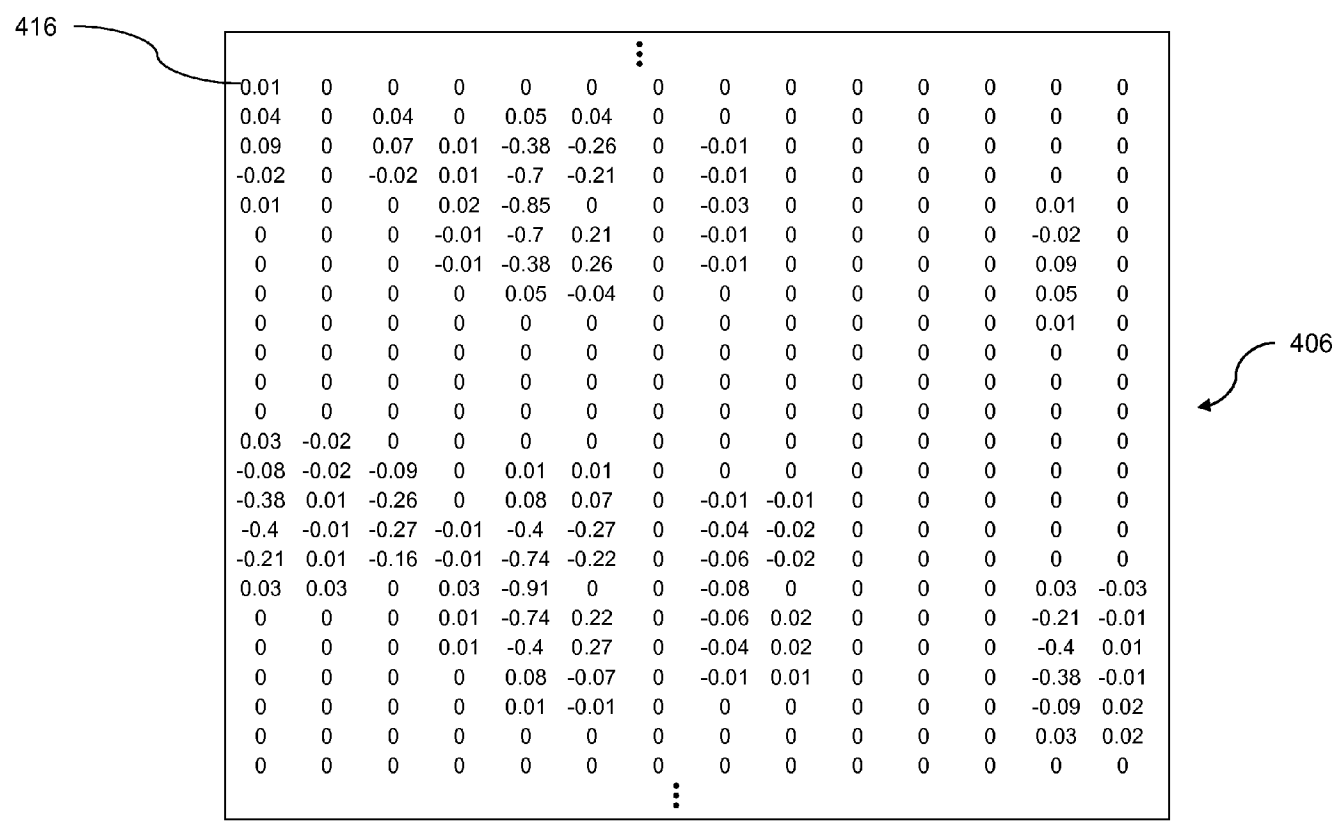

FIG. 4C is an example matrix representation for an imaging system for pixel coherency. A matrix of numbers 406 is shown to illustrate a sample from matrix which results from an example imaging system for pixel coherency. While a small sample of matrix elements of a pixel-coherency matrix is shown, a pixel-coherency matrix may be very large. A computer-aided design tool or other appropriate calculating tool or method may calculate the matrix 406. One matrix resulting from a convolution, such as shown in FIG. 4B, may be stacked to form a single-column vector, depending on the dimensions of a convolution matrix such as 404. For example, if matrix 404 were eleven-by-eleven elements, then a column may be eleven-by-eleven elements tall. A number of columns may be equal to a number of pseudo-coherent elements multiplied by the number of polarization states. For example, for three polarization states, x, y, and z, the number of pseudo-coherent elements would be multiplied by three. As before, a matrix may show results of solving an optical system, including optical systems for lithography of semiconductor circuits and systems. The computational complexity of and requirements for solving a matrix representation of an imaging system are determined by the size of the matrix representing the imaging system. For example, let an example matrix be of dimensions M by N. Then the computational time required to determine the entire matrix for an imaging system may be $M^2 \times N$, or $N^2 \times M$, whichever computation is smaller.

Figure 5:
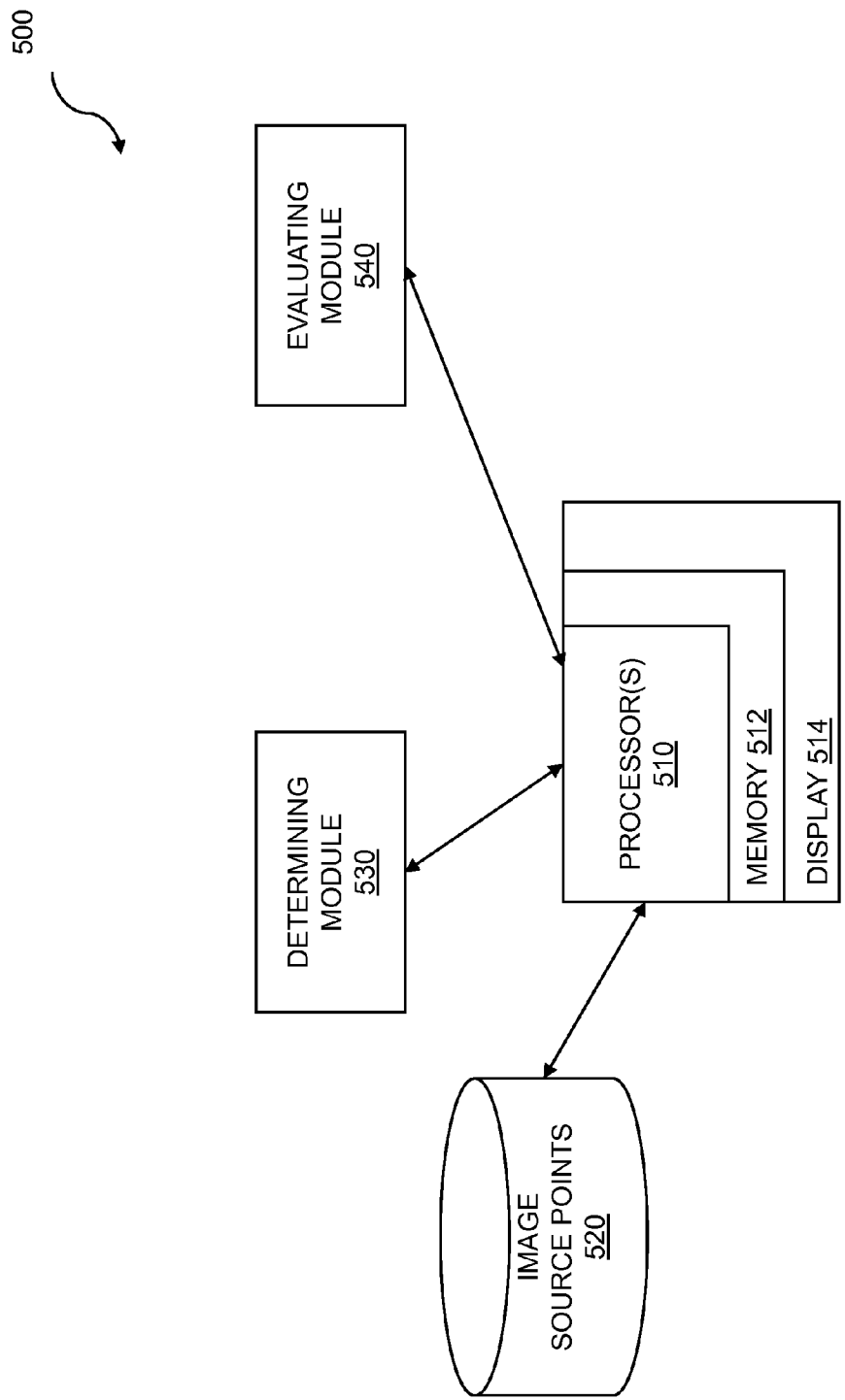
FIG. 5 is a system diagram for pixel-source optics calculation.

FIG. 5 is a system diagram for performing pixel source optics calculations. A system 500 may include one or more processors 510 as well as a determining module 530 and an evaluating module 540. The one or more processors 510 are coupled to a memory 512, which stores instructions, and a display 514. The display 514 may be any electronic display, including but not limited to, a computer display, a laptop screen, a net-book screen, a tablet computer screen, a cell phone display, a mobile device display, a remote with a display, a television, a projector, or the like. The memory 512 may store code, optics information, mask information, layer information, design data, instructions, system support data, intermediate data, analysis results, and the like.

The processors 510 may be configured to access image source points 520, the determining module 530, and the evaluating module 540. In at least one embodiment, the one or more processors 510 accomplish the functions of the determining module 530 and/or the evaluating module 540. The processors 510 may be configured to obtain image source points for optical-lithography simulation. The simulating may be based on calculations of partially coherent images. The processors 510 may be configured to determine 530 that two or more points from the set of source points are neighboring source points. The source points may be part of a grid. The processors 510 may be configured to determine spatial coherence between the neighboring points. Two or more neighboring points may be spatially coherent. Spatial coherence may permit grouping of neighboring points into pseudo spatially coherent area elements. The pseudo spatially coherent elements may be treated as a coherent summation instead of an incoherent summation. There may be fewer pseudo-spatially coherent area elements than image source points. The processors 510 may be configured to evaluate image calculations based on spatial coherence. The evaluating may permit simulation of a partially coherent image in optical-lithography simulation. The evaluating may involve fewer incoherent points while maintaining high resolution of source and pupil. The evaluating may involve layout analysis for optical proximity correction (OPC) or rigorous modeling. The system 500 may perform a computer-implemented method for image analysis comprising obtaining a set of source points for an image, determining that two or more points from the set of course points are neighboring source points, determining spatial coherence between the neighboring source points, and performing image calculations based on spatial coherence. The system 500 may perform a computer-implemented method for image analysis comprising: obtaining a set of source points for an image; determining that two or more points from the set of source points are neighboring source points; for the neighboring source points, evaluating a correlation for light waves so that the neighboring source points can be treated as one point from an image calculation perspective; and performing image calculation, for semiconductor lithography, based on the neighboring source points being treated as one point. The system 500 may perform the method where the set of source points comprise a source map and wherein the method further comprises dividing the source map into pseudo-coherent cells using a course grid; using at least one cell from the course grid to form a new pseudo coherent system wherein the new pseudo coherent system is formed by convolving the at least one cell with a lens pupil function; and performing optical proximity correction based on the image calculation. The system 500 may comprise a computer program product embodied in a non-transitory computer readable medium for image analysis. The computer program product embodied in a non-transitory computer readable medium for image analysis may comprise code for obtaining a set of source points for an image, code for determining that two or more points from the set of source points are neighboring source points, code for evaluating spatial coherence between the neighboring source points, and code for performing image calculation based on the spatial coherence.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for image analysis comprising:
    obtaining, using one or more processors, a set of source points for an image;
    determining that two or more points from the set of source points are neighboring source points;
    evaluating spatial coherence between the neighboring source points; and
    performing image calculation based on the spatial coherence.

2. The method of claim 1 further comprising performing optical proximity correction based on the image calculation.

3. The method of claim 1 wherein the image calculation includes Eigen value decomposition.

4. The method of claim 3 wherein the Eigen value decomposition is part of kernel truncation.

5. The method of claim 1 wherein the two or more points have spatial coherence.

6. The method of claim 5 further comprising reducing a number of points for calculation based on the spatial coherence.

7. The method of claim 6 wherein the reducing is based on an elimination of an assumption of incoherency.

8. The method of claim 7 further comprising reducing calculation complexity based on the reducing of the number of points for calculation due to a reduced number of incoherent points.

9. The method of claim 1 wherein the set of source points comprise a source map.

10. The method of claim 9 further comprising dividing the source map into pseudo-coherent cells.

11. The method of claim 10 wherein the dividing is accomplished using a course grid.

12. The method of claim 11 further comprising using one cell from the course grid to form a new pseudo coherent system.

13. The method of claim 12 wherein the new pseudo coherent system is formed by convolving the one cell with a lens pupil function.

14. The method of claim 11 wherein the course grid comprises pseudo spatially coherent cells.

15. The method of claim 1 wherein the set of source points comprise pixelated sources.

16. The method of claim 1 wherein the neighboring source points are determined based on dividing a source map into pseudo coherent cells.

17. The method of claim 16 wherein the dividing is based on a course grid.

18. The method of claim 16 further comprising convolving one of the pseudo coherent cells with a pupil to form a pseudo coherent system.

19. The method of claim 1 wherein the image calculation is fast image calculation.

20. The method of claim 1 wherein the set of source points comprise a source map and wherein the method further comprises dividing the source map into pseudo-coherent cells using a course grid; using at least one cell from the course grid to form a new pseudo coherent system wherein the new pseudo coherent system is formed by convolving the at least one cell with a lens pupil function; and performing optical proximity correction based on the image calculation.

21. A computer-implemented method for image analysis comprising:
    obtaining, using one or more processors, a set of source points for an image;
    determining that two or more points from the set of source points are neighboring source points;
    for the neighboring source points, evaluating a correlation for light waves so that the neighboring source points can be treated as one point from an image calculation perspective; and
    performing image calculation, for semiconductor lithography, based on the neighboring source points being treated as one point.

22. A computer system for image analysis comprising:
    a memory which stores instructions;
    one or more processors coupled to the memory wherein the one or more processors are configured to:
        obtain a set of source points for an image;
        determine that two or more points from the set of source points are neighboring source points;
        evaluate spatial coherence between the neighboring source points; and
        perform image calculation based on the spatial coherence.

23. A computer program product embodied in a non-transitory computer readable medium for image analysis comprising:
    code for obtaining a set of source points for an image;

code for determining that two or more points from the set of source points are neighboring source points;

code for evaluating spatial coherence between the neighboring source points; and code for performing image calculation based on the spatial coherence.

24. The computer program product of claim 23 further comprising performing optical proximity correction based on the image calculation.

25. The computer program product of claim 23 wherein the two or more points have spatial coherence and further comprising reducing a number of points for calculation based on the spatial coherence.

26. The computer program product of claim 23 wherein the set of source points comprise a source map and further comprising dividing the source map into pseudo-coherent cells.

27. The computer program product of claim 26 wherein the dividing is accomplished using a course grid and further comprising using one cell from the course grid to form a new pseudo coherent system.

28. The computer program product of claim 23 wherein the neighboring source points are determined based on dividing a source map into pseudo coherent cells and further comprising convolving one of the pseudo coherent cells with a pupil to form a pseudo coherent system.

29. The system of claim 22 wherein the one or more processors are further configured to perform optical proximity correction based on the image calculation.

30. The system of claim 22 wherein the two or more points have spatial coherence and wherein the one or more processors are further configured to reduce a number of points for calculation based on the spatial coherence.

31. The system of claim 22 wherein the set of source points comprise a source map and wherein the one or more processors are further configured to divide the source map into pseudo-coherent cells.

32. The system of claim 31 wherein the dividing is accomplished using a course grid and wherein the one or more processors are further configured to use one cell from the course grid to form a new pseudo coherent system.

33. The system of claim 22 wherein the neighboring source points are determined based on dividing a source map into pseudo coherent cells and wherein the one or more processors are further configured to convolve one of the pseudo coherent cells with a pupil to form a pseudo coherent system.

* * * * *